US008046961B1

(12) United States Patent
Cutting et al.

(10) Patent No.: US 8,046,961 B1
(45) Date of Patent: Nov. 1, 2011

(54) TACTICAL SOLAR POWER SYSTEM

(75) Inventors: Paul G. Cutting, Stafford, TX (US); Kevin Louis Conlin, Houston, TX (US)

(73) Assignee: Solarcraft, Inc., Stafford, TX (US)

( * ) Notice: Subject to any disclaimer, the term of this patent is extended or adjusted under 35 U.S.C. 154(b) by 392 days.

(21) Appl. No.: 12/472,290

(22) Filed: May 26, 2009

Related U.S. Application Data

(60) Provisional application No. 61/056,179, filed on May 27, 2008.

(51) Int. Cl.
*H01L 31/042* (2006.01)

(52) U.S. Cl. ....... 52/173.3; 52/123.1; 206/510; 439/500

(58) Field of Classification Search .............. 52/239, 52/243, 143, 123.1, 173.3; 439/500, 96–100, 439/123; 361/679.01, 679.02, 729, 725; 206/501, 509, 4.27; 135/245; 320/101; 312/107, 312/111, 198, 240

See application file for complete search history.

(56) References Cited

U.S. PATENT DOCUMENTS

| 4,348,843 | A  | * | 9/1982  | Cairns et al. ............... 52/167.1 |
| 5,969,501 | A  | * | 10/1999 | Glidden et al. ............... 320/101 |
| 6,201,181 | B1 | * | 3/2001  | Azzam et al. ............... 136/244 |
| 6,406,812 | B1 | * | 6/2002  | Dreulle et al. ............... 429/99 |
| 6,465,724 | B1 | * | 10/2002 | Garvison et al. ............ 136/244 |
| 6,552,257 | B1 | * | 4/2003  | Hart et al. ............... 136/246 |
| 6,718,681 | B2 | * | 4/2004  | Bhullar ............... 43/1 |
| 6,874,634 | B2 | * | 4/2005  | Riley ............... 206/439 |
| 7,011,214 | B2 | * | 3/2006  | Brackmann et al. ......... 206/509 |
| D584,223  | S  | * | 1/2009  | Cooper ............... D13/102 |
| 7,492,120 | B2 | * | 2/2009  | Benn et al. ............... 320/101 |
| 7,780,026 | B1 | * | 8/2010  | Zuckerman ............... 220/23.4 |
| 7,834,580 | B2 | * | 11/2010 | Haines ............... 320/101 |
| 7,915,519 | B2 | * | 3/2011  | Kobayashi ............... 136/251 |
| 7,956,279 | B2 | * | 6/2011  | Morita et al. ............... 136/251 |
| 2002/0180404 | A1 | * | 12/2002 | Benn et al. ............... 320/101 |
| 2003/0101634 | A1 | * | 6/2003  | Bhullar ............... 43/1 |
| 2003/0121514 | A1 | * | 7/2003  | Davenport et al. ........... 126/570 |
| 2005/0155889 | A1 | * | 7/2005  | Lown ............... 206/501 |
| 2005/0224384 | A1 | * | 10/2005 | Sands et al. ............... 206/503 |
| 2007/0013340 | A1 | * | 1/2007  | Mattichak ............... 320/101 |
| 2007/0251132 | A1 | * | 11/2007 | Luoma et al. ............... 40/541 |
| 2008/0100707 | A1 | * | 5/2008  | Brown ............... 348/158 |
| 2008/0196758 | A1 | * | 8/2008  | McGuire ............... 136/245 |
| 2008/0252084 | A1 | * | 10/2008 | Francis et al. ............... 292/317 |
| 2009/0079161 | A1 | * | 3/2009  | Muchow et al. ............... 280/400 |
| 2009/0183405 | A1 | * | 7/2009  | Wilkes ............... 40/543 |
| 2010/0001681 | A1 | * | 1/2010  | Zhang et al. ............... 320/101 |
| 2010/0013310 | A1 | * | 1/2010  | Day ............... 307/64 |
| 2010/0039061 | A1 | * | 2/2010  | Rosenbaum ............... 320/101 |
| 2010/0060229 | A1 | * | 3/2010  | Benn et al. ............... 320/101 |
| 2010/0090605 | A1 | * | 4/2010  | Nevins ............... 315/159 |
| 2010/0132274 | A1 | * | 6/2010  | Reyal et al. ............... 52/173.3 |
| 2010/0151299 | A1 | * | 6/2010  | Ha et al. ............... 429/61 |
| 2010/0225266 | A1 | * | 9/2010  | Hartman ............... 320/101 |
| 2010/0231161 | A1 | * | 9/2010  | Brown ............... 320/101 |
| 2011/0056146 | A1 | * | 3/2011  | Appert ............... 52/79.1 |

* cited by examiner

*Primary Examiner* — Eileen D Lillis
*Assistant Examiner* — Alp Akbasli
(74) *Attorney, Agent, or Firm* — Buskop Law Group, PC; Wendy Buskop

(57) ABSTRACT

A tactical portable solar control system which can be modular, extremely resistant to destruction, capable of being assembled by a person without instructions, and which creates a small footprint when assembled.

24 Claims, 11 Drawing Sheets

TACTICAL SOLAR POWER SYSTEM

CROSS REFERENCE TO RELATED APPLICATIONS

The current application claims priority and benefit to co-pending U.S. Provisional Patent Application Ser. No. 61/056,179 filed on May 27, 2008, entitled "Tactical Solar Power System". This application is hereby incorporated in its entirety.

FIELD

The embodiments generally relate to a tactical portable solar control system usable with personal communication devices and other load generating devices or recharging devices for use in remote areas that lack easy recharging.

BACKGROUND

A need has existed for a recharging station in the field of combat that is quiet, easy to install, and extremely tough, if not literally indestructible.

A need has existed for a recharging station, particularly for walkie-talkies used in the field, which can be quickly assembled, quickly dissembled, and creates a small footprint when in use.

The present embodiments meet these needs.

BRIEF DESCRIPTION OF THE DRAWINGS

The detailed description will be better understood in conjunction with the accompanying drawings as follows.

Figure 1:
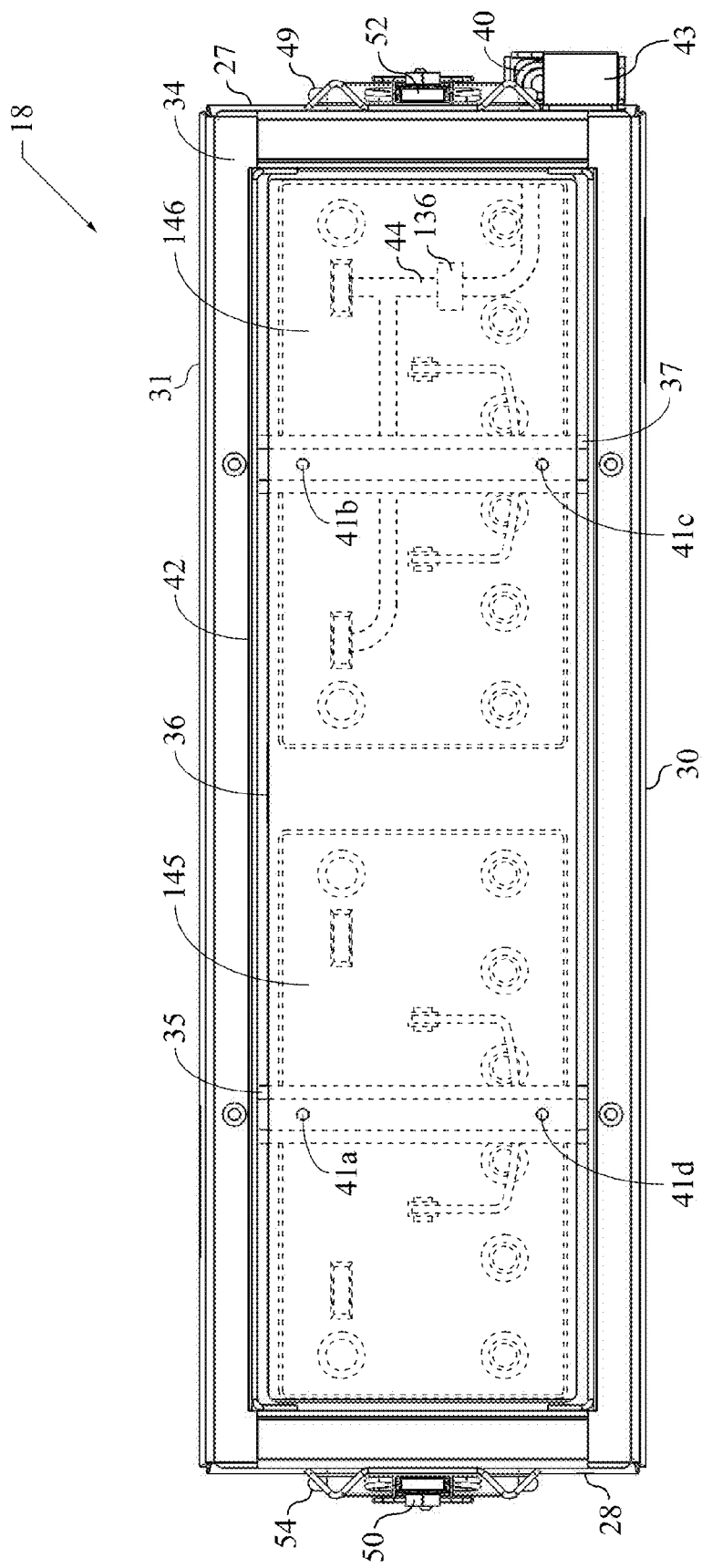
FIG. 1 is a top view of a battery box usable in the system.

The present embodiments are detailed below with reference to the listed Figures.

DETAILED DESCRIPTION OF THE EMBODIMENTS

Before explaining the present apparatus and system in detail, it is to be understood that the apparatus is not limited to the particular embodiments and that it can be practiced or carried out in various ways.

The present embodiments relate to a tactical solar power station, which can be modular, extremely resistant to destruction, capable of being assembled by a person without instructions, and which creates a small footprint when assembled.

The present system can be modular, enabling individual parts to be individually replaced without having to replace the entire system. This modular design can enable lower maintenance costs, and easier, more efficient maintenance and replacement of parts.

The system can include a solar array assembly, a solar control panel assembly, a system base, and a plurality of batteries in destruction resistant boxes, which can be all connected together and modularized such that an individual can assemble the system without any printed instructions, or if unable to read or understand the printed instructions. The system can be useable in a battlefield, and is designed to withstand harsh conditions, dirt, impacts, and potential damage caused by incorrect assembly attempts by individuals.

The tactical solar control system is designed to use from about 1 battery to about 8 batteries, within tough, impact resistant, water resistant, easily latched battery boxes. Each battery can be individually protected in individual battery boxes that can be latched together.

Each battery box can be contemplated to be a metal box with 4 integral metal sides and a metal bottom.

The top of each battery box can be contemplated to be a metal frame running along the perimeter of the sides of the battery box, rather than a solid metal plate like embodiments of the sides and bottom.

The frame can be formed from a plurality of integral top flanges secured to the sides of the box. Within the frame can be a shatter resistant, transparent plate. In an embodiment, the plate can have three holes. Two of the holes can have identical diameters and can be used to orient fasteners, such as screws, through the transparent plate to secure a bar for retaining the battery in the battery box. The third hole in the plate can be larger in diameter than the other two holes and can allow a top battery cable to connect to the positive terminal of the battery in the box on one end, and to a top battery cable connector on the other end. The top battery cable connector can be contemplated to be securely affixed, non-removably, to the battery box on the outside.

In an embodiment, the top battery cable connector can be screwed directly to the transparent plate. The plate can be made of polycarbonate. The connector can be any type of suitable connector, such as one made by Anderson Power Products.

In another embodiment, the top battery cable connector can be non-removably attached to a spacer, which can be a thin metal plate, and both the top battery cable connector and the spacer can then be secured to the transparent plate. The spacer can be useable to create a water resistant connection between the top battery cable connector and another battery. In an embodiment, the transparent plate can have dimensions ranging from about 6 inches to about 12 inches in length, about 5 inches to about 12 inches in width, and about 0.25 inches to about 0.5 inches in thickness.

Each battery box can have a connector that is differently sized from each of the other connectors. By using connectors of different sizes fires and shocks to users are prevented by essentially preventing a user from using the wrong battery connector with the wrong cable.

In an embodiment, each battery box connector can be colored differently from connectors affixed to other boxes, to facilitate easy assembly without use of instructions.

In an embodiment, the top battery cable and top battery cable connector can be identically color coded, having a certain color, such as red, enabling a person without written instructions, to assemble the battery boxes without shorting out the system, by matching connectors having like colors.

The shatter resistant transparent place can have a length and width smaller than those of the top of the box. The top of the box can form a metal frame, and the transparent plate can sit within that frame, preventing water from reaching the battery terminals.

Additionally the top of the box can have an integral projecting top flange, which can be located about 1 inch from the edge of each side of the box. The integral projecting top flange is not only located inside the perimeter of the box, but can extend between about 0.5 inches to about 1.5 inches inch above the top of the box. In an embodiment, the integral projecting top flange can be made from solid metal, such as a sturdy aluminum and steel mix. The integral projecting top flange can enable nesting of the battery box into the bottom of the solar control panel assembly, or into the battery base during transport. This secure nesting feature can enable secure, free standing use of the present system, without the apparatus tipping over, thereby enabling the present system to have a small footprint.

A side battery cable can extend from the side of each battery box, which can connect to the battery on one end and to a side battery cable connector on the other end. Like the top battery cable connector, the side battery cable connector can be non-removably affixed to the side of the battery box, and can be color coded, enabling a user without written directions or instructions to property assemble the components quickly in the field, for immediate use. The side connector can be contemplated to have a different size than the connector on the top.

The batteries in the battery boxes can be connected in parallel or in series using the various battery cable connectors.

The bottom of each battery box can include a bottom flange extending along the perimeter of the bottom that is about 1 inch high, having flange extensions inwardly oriented from the edge of the bottom flange. The flange extensions can extend from the perimeter of the bottom of the battery box and allow for secure engagement with the integral projecting top flange of another box. The inwardly oriented flange can enable the bottom of the battery box to nest around the integral top projecting flange.

Each battery box can form a destruction resistant, transportable, modular nesting engagement with other battery boxes.

A first handle can be attached to the left side of one or more battery boxes, and a second handle can be secured to the right side, for providing ease when lifting the battery boxes. The first and second handles can be spring loaded handles for easy retraction to their original positions. Latches can be disposed adjacent each handle for connecting the battery boxes to the solar control panel assembly or to the base for transport.

In an embodiment, third and fourth latches can be located on the front and back of the battery boxes.

The battery box base can have a base bottom with metal sides extending from the bottom of the box base forming a chamber. Bottom flanges can extend inwardly from the sides of the base forming the chamber enabling a secure fitting other flanges on other components of the system.

A solar control panel assembly can manage the system. The solar control panel assembly "SCPA" can include a destruction resistant box.

The destruction resistant box can have a metal base, a metal front side, a metal sloping front side, a metal top, a metal first side, and a metal second side.

The metal base can have a metal base flange, which can extend around the periphery of the metal base, forming an open chamber, enabling the destruction resistant box metal base to fit integrally over the integral top flanges of two battery boxes.

The metal base can additionally have a first base flange extending from the metal base flange inwardly over a portion of the open chamber, and a second base flange opposite the first base flange, extending from the metal base flange inwardly over a portion of the open chamber. In another embodiment, the metal base can have 4 flanges.

The destruction resistant box can be contemplated to have an openable, shatter resistant transparent cover, which can be made from polycarbonate. In an embodiment, the cover can be L-shaped or a flat panel. The transparent cover can be hinged to the metal front side, enabling the transparent cover to open. The transparent cover can range from about 0.25 inches to about 0.5 inches in thickness and can be made of a tough clear polymer, graphite composite, or other materials that enable clear viewing of the gauges protected by the cover.

It can be noted that the shatter resistant cover can not be broken by an average human with a hammer. The shatter resistant panel can be resistant to penetration by a bullet.

The transparent cover can provide the benefit of rapid, nearly instantaneous monitoring of the solar control panel assembly at a glance, while protecting the contents of the assembly, which enhances overall safety and can be of great benefit in military uses.

The destruction resistant box can support various interconnected solar components.

The interconnected solar components can be electrical and can include at least one non-interchangeable control panel connector, and a solar controller, such as model PS-30M made by Morningstar. Additionally, the solar control panel assembly can include at least one DC circuit breaker, such as one made by Circuit Breakers, Incorporated.

The solar control panel can include at least one charge meter for each battery, such as one manufactured by East Penn Manufacturing or Deka Solar Line. Additionally, the solar panel can include a surge arrestor, such as one made by Transtector, a DC to DC converter, such as one made by Solarcraft, an auxiliary battery charger, such as one made by Newmar, and an auxiliary battery charger connector, such as one made by Anderson Power Products.

The components can be connected in the following manner: The solar panels can be connected to the combiner box through waterproof connectors. The combiner box can configure the solar panels in a series or in a parallel configuration and can combine the output of the solar panels to a single outdoor polarized output connector. An outdoor "homerun cable" can transmit power from the combiner box to the control enclosure. The control enclosure can monitor the battery temperature and state of charge and can connect the solar array to the batteries with a PWM (pulse with modulated) output to maintain the batteries at a full state of charge. The solar controllers can also provide load control and can feature an LVD (low voltage disconnect) circuit to protect the batteries from excessive discharge. The batteries can be configured in a series or in a parallel configuration to provide power at night and during cloudy periods. The control enclosure can also include lightning surge protectors and a DC/DC converter to provide a regulated voltage output to the customer's load connections.

At least one solar receptacle, such as one manufactured by Pass and Seymour, for receiving a solar array cable, can be installed on one side of the solar control panel assembly. A protective hinged cover can be disposed over the solar receptacle to prevent water, dirt or debris from entering the connection. An example of a solar array cable can be an outdoor cable, such as those made by Carol. Two or more solar receptacles can be installed on the side of the solar control panel assembly.

At least one plug connector, such as one made by Harris RF Communications, can be located on the side opposite the solar receptacle. The plug connector can enable a power cable to connect to the solar control panel assembly to power a load. In an embodiment, from about 2 plug connectors to about 8 plug connectors can be installed in the solar control panel assembly. A second protective hinged or openable cover can be located over the plug connectors to prevent water, dirt or debris from entering the connection.

The first and second protective covers can be made from metal, durable plastic, or another durable material.

A first latch can be used to secure the shatter resistant transparent cover to the assembly on one end, and a second latch can be used to secure the cover to the assembly on the other end.

A third latch and a fourth latch can be connected to the metal sloping front side at the top to secure solar control panel assembly to the base during transport.

A fifth, sixth, seventh, and eighth latch can be used to secure the assembly to the battery enclosures.

A system base can support at least two of the destruction resistant transportable modular nesting battery boxes during operation, and the same base can be used to help secure the solar control panel assembly during transport.

The system base can have a storage chamber, which can be surrounded by a first base flange, a second base flange, a third base flange, and a fourth base flange. The four base flanges of the system base can enable secure containment of the base around the integral projecting top flanges of the battery boxes, creating a secure, stable, and safe tower during operation. The storage chamber can be used for storing battery box interconnect cables.

The system base can have a plurality of destruction resistant base latches for engaging the solar control panel assembly. The latches can enable the system base to be secured to the battery boxes during deployment of the system.

It can be contemplated that the latches can be butterfly latches. It can also be contemplated that each latch can have a M-shaped protection device incorporated therein. The M-shaped protection devices can also be referred to herein as a "latch protector" and can be used to prevent destruction of each latch.

The solar array assembly can connect to the batteries and the solar control panel assembly, powering the batteries and the solar control panel.

The solar array assembly can include at least one solar panel. However, at least 2 solar panel, or more solar panels can be connected in a series or in a parallel configuration, can be used on the solar array assembly to provide more power. Use of fewer panels results in a more lightweight system, enabling easier transport. In an embodiment, the solar panels can be 12 volt panels.

The solar array assembly can include a mounting bracket which can be connected to a mounting backbone. Each mounting backbone can support a plurality of mounting ribs and a combiner box for collecting power from the solar panels. The combiner box can include a polarized socket and a cable with a polarized plug connector for engaging the polarized socket and transmitting power from the solar panels to the solar control panel assembly. The cable can plug into the solar control panel assembly, which in turn can plug into the batteries.

Electronic devices or "loads" can be plugged into the plug connectors to be charged by the system.

A strain relief assembly can be used for protecting the cable while engaged in the polarized plug connector, preventing damage. The strain relief assembly can be a U-shaped metal cover disposable over the plug for that added protection.

A plurality of T-handle pin connectors can be used to connect the backbone to the mounting bracket. T-handle pin connectors, which can be spring loaded, can also be used to connect the mounting ribs to the mounting backbone. T-handle pin connectors can also secure the solar panels to the mounting ribs. Spring loaded T-handle pin connectors, such as those made by Fixture Works, can be used for quick release and quick installation, and provide an unexpected benefit for use with military installations.

The combiner box is a box with recessed solar module receptacles on a first side, and solar output cable receptacles on a second side. Two mounting flanges can attach to the box for mounting to the solar array mounting bracket. The other two sides of the combiner box can be solid panels.

In an embodiment, it can be contemplated that the combiner box can have a hinged or completely removable cover.

In an embodiment, the solar array assembly can additionally use a channel, which can be contemplated to be a hollow steel tubular, for engaging the mounting rib, which increases durability and strength in the field. Additionally, the solar array assembly can be constructed using a pipe stand, which is a portable, small footprint base for the array.

In another embodiment, it can be contemplated that the combiner box can provide surge protection.

The solar modules can be contemplated to be 12 volt modules, such as KC-85 modules, manufactured by Kyocera Solar.

The tactical solar control system can further include a tamperproof solar charging power source, which can be in communication with the control panel for maintaining battery charge while in storage. The charging source can be a metal openable and lockable suitcase.

In an embodiment, a portable base can be used with a base body. The base body can have at least two base handles, which can be secured to the base body enabling ease of lifting and support.

At least a first base latch can be secured to the base body and a second base latch can be secured to the base body opposite the first base latch. Additional base latches can be used in alternate embodiments.

A flanged base support can be disposed on a bottom perimeter of the base body for supporting the base body. A base top flange can be disposed at a top of the base body around the perimeter of the walls.

In an embodiment, the lightweight destruction resistant battery box can be removably secured to the portable base with the first base latch and the second base latch.

In an embodiment, the battery box can include a battery box base, which can further be connected to a front, back, first side and second side. The front, back, first side and second side can be made of metal.

The battery box can have an integral projecting top flange with a top edge disposed around the front, back, first side and second side.

The battery box can have at least a first hold down brace between the first side and the second side disposed below the top edge of the integral projecting top flange.

A shatter resistant plate can be disposed within the integral projecting top flange beneath the top edge and over the at least one hold down brace secured to the hold down brace with at least one fastener.

A non-removably mounted non interchangeable battery connector can be secured to the front, which can be used for engaging a side battery box cable and disposed between at least one battery in the battery box and the non-removably mounted non-interchangeable battery connector. The battery box can have at least 2 batteries and a plurality of hold down braces.

At least one battery connector safety cover can be disposed over the non-removably mounted non-interchangeable battery connector and secured to a side wall of battery box.

A first battery box latch can be disposed on the front and a second battery box latch can be disposed on the back for connecting the battery box to the portable base. In additional embodiments, more than one latch can be used.

The latches can be used to secure the battery box in a stackable manner to a stackable solar control cabinet. The stackable solar control cabinet can further have a first side, a second side and a back side, which can be connected to a cabinet base.

The stackable solar control cabinet can further have an openable vented destruction resistant cover.

At least one solar controller can be located in the openable vented destruction resistant box. The solar controller can be connected to a first circuit breaker, which can be located between the battery and the solar controller, and a second circuit breaker can be located in the stackable solar control cabinet between the solar controller and a solar array.

In an embodiment, at least one receptacle can be located in the stackable solar control cabinet for receiving power from the solar array assembly to provide a current to an outside source.

At least one load connector can be disposed outside the stackable solar control cabinet for powering a load.

At least a cover latch can be positioned on the stackable solar control cabinet for fastening the openable vented destruction resistant cover to the stackable solar control cabinet.

The first battery box latch and second battery box latch can be used to secure the stackable solar control cabinet to the battery box and the first and second base latches can secure the base to the battery box forming a stacked assembly A cable can communicate between the battery box and the stackable solar control cabinet.

The solar array assembly can be in communication with the stackable solar control cabinet and can have a mast connected to a solar array base. Additionally, a mounting backbone can connect to the mast. A plurality of mounting ribs can be disposed on the mounting backbone. At least one solar panel can further be mounted to each mounting rib.

A combiner box can be disposed on the mast. The combiner box can have a socket for collecting the power from the solar panel and a plug connector for transferring the power from the at least one solar panel to connectors on the stackable solar control cabinet. The power from the at least one solar panel can be used to provide electrical power to electrical devices in the field.

In an embodiment, a battery charger can be used with a A/C input receptacle connected to an AC power source, and a charge meter can be used for each battery connected to the battery charger.

In another embodiment, a gasket can be disposed between the stackable solar control cabinet. The openable vented destruction resistant cover can be supported by at least one hydraulic piston, which can be disposed between the stackable solar control cabinet and the openable vented destruction resistant cover. In additional embodiments, more then one hydraulic piston can be used.

In another embodiment, each solar panel can be contained within a frame. The frames can each have a frame handle and at least one frame latch for connecting frames together, and each frame can slidably engage at least one of the mounting ribs.

In an embodiment, a solar controller connector cover can be disposed over the solar controller connectors disposed on the outside of the stackable solar control cabinet. A load fuse can be used and can further be connected to the solar controller.

A temperature sensor can be used within the stackable solar control cabinet and connected to at least one solar controller.

In still another embodiment, the stackable solar control cabinet can have an openable vented destruction resistant cover, which can comprise a viewing plate of shatter resistant transparent material.

In an embodiment, a solar panel tilt assembly can be connected between the backbone and the mast providing variable degrees of tilt for the solar panel, which can further use an angle changing tilt locking mechanism. The solar panel tilt assembly can be made of four plates disposed on either side of the mast, in each plate can be holes through which one or more pins can penetrate creating different angles of tilt for the solar array.

In another embodiment, the solar array base can be made of a plurality of removable slidable support arms, which can be secured to the solar array base and each removable slidable support arms can have at least one support arm handle.

In an embodiment, the solar array base can have at least one support arm holder connected to the solar array base to support each removable slidable support arm. The base can be secured to each of the removable slidable support arms with at least one fastener enabling the solar array assembly to be collapsible and provide a small profile for transport.

A foot can be disposed on each end of the removable slidable support arms providing additional stability to the mast. A holder can secure to the base allowing up to 360 degrees of rotation of the mast and a mast lock for locking the mast at a desired degree of rotation.

A toothed collar can surround the mast and be disposed on the holder enabling quick re-orientation of the mast and locking with the mast lock.

A ground can be secured on the outside of the vented destruction resistant box.

The embodiments can contemplate that no single component of the system weighs more than about 170 pounds.

It can also be noted that the first circuit breaker can communicate between the solar array and the solar controller and the second circuit breaker can communicate between one of the batteries and the solar controller.

It can be noted that the shatter resistant protective cover of the battery box can be a plate of transparent polycarbonate. The cover can further be L-shaped and connected by a hinge to the back side.

It can also be noted that a safety fuse can be disposed in the battery box connected to at least one battery.

Turning now to the Figures, FIG. 1 shows a top view of a battery box 18 usable in the stackable system.

The top view shows a front 27, a back 28, a first side 30 and a second side 31. In an embodiment, the front, back first side and second side can be made of metal. The battery box 18 is also shown with a top edge 34. Below the top edge 34 can be a first hold down brace 35. A second hold down brace 37 is also shown disposed between the first side 30 and the second side 31.

Held to the first hold down brace 35 can be a shatter resistant plate 36, which can enable the batteries to be viewable in alternate embodiments. An integral projecting top flange 42 is shown along the interior of the top edge 34. A first battery 145 and a second battery 146 can be contained in the battery box 18.

The front 27 can have a non-removably mounted non-interchangeable battery connector 40 that can have a battery connector safety cover 43. The non-removably mounted non-interchangeable battery connector 40 can engage a side battery box cable 44, which can be disposed between the first battery 145 and the non-removably mounted non-interchangeable battery connector 40.

In addition, the front 27 can have a first battery box handle 49 and a first battery box latch 52. The back 28 can have a second battery box handle 54 and a second battery box latch 50. A safety fuse 136 can be used with the battery(s) 145, 146 in the battery box 18.

Figure 2:
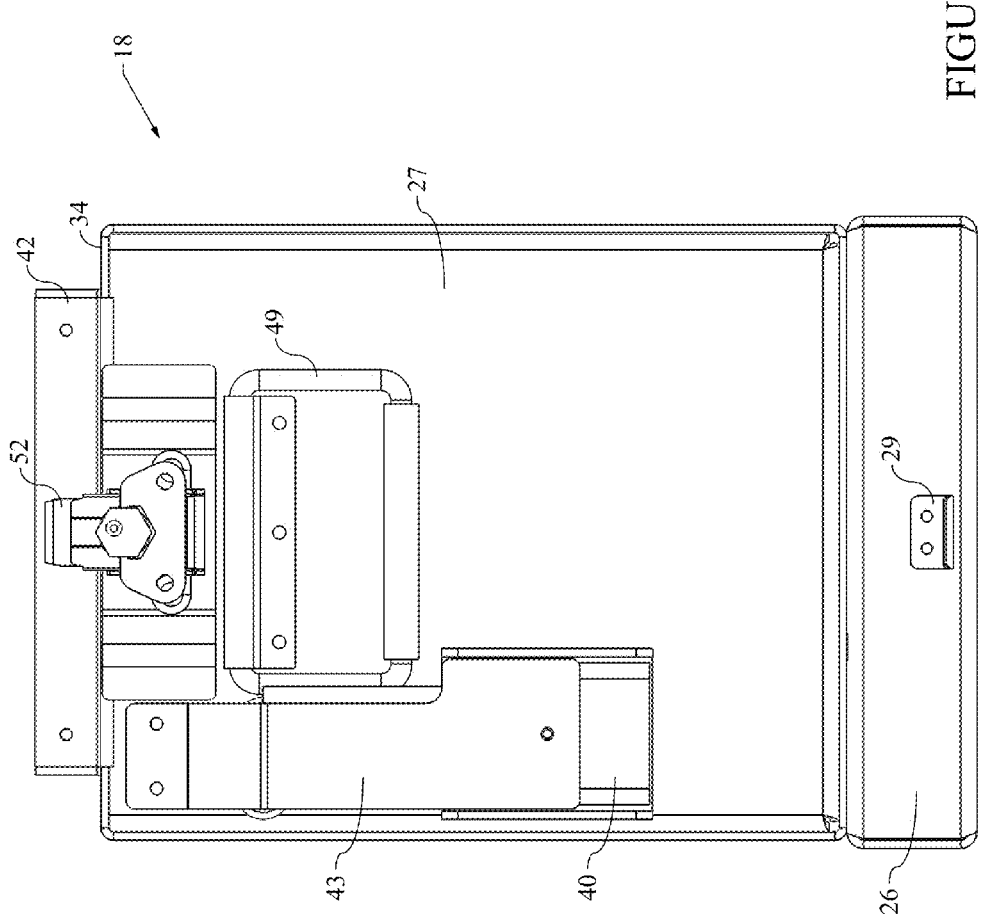
FIG. 2 is a front view of the battery box usable in the system.

FIG. 2 shows a front view of the front 27 of the battery box 18 with a battery box base 26. The battery box base 26 can have at least one latch connect 29 for engaging a latch from a portable base 10, later shown in FIG. 3. The first battery box handle 49, the first battery box latch 52, the top edge 34 and the integral projecting top flange 42 are shown as well.

FIG. 2 further shows the non-removably mounted non-interchangeable battery connector 40 and the battery connector safety cover 43.

Figure 3:
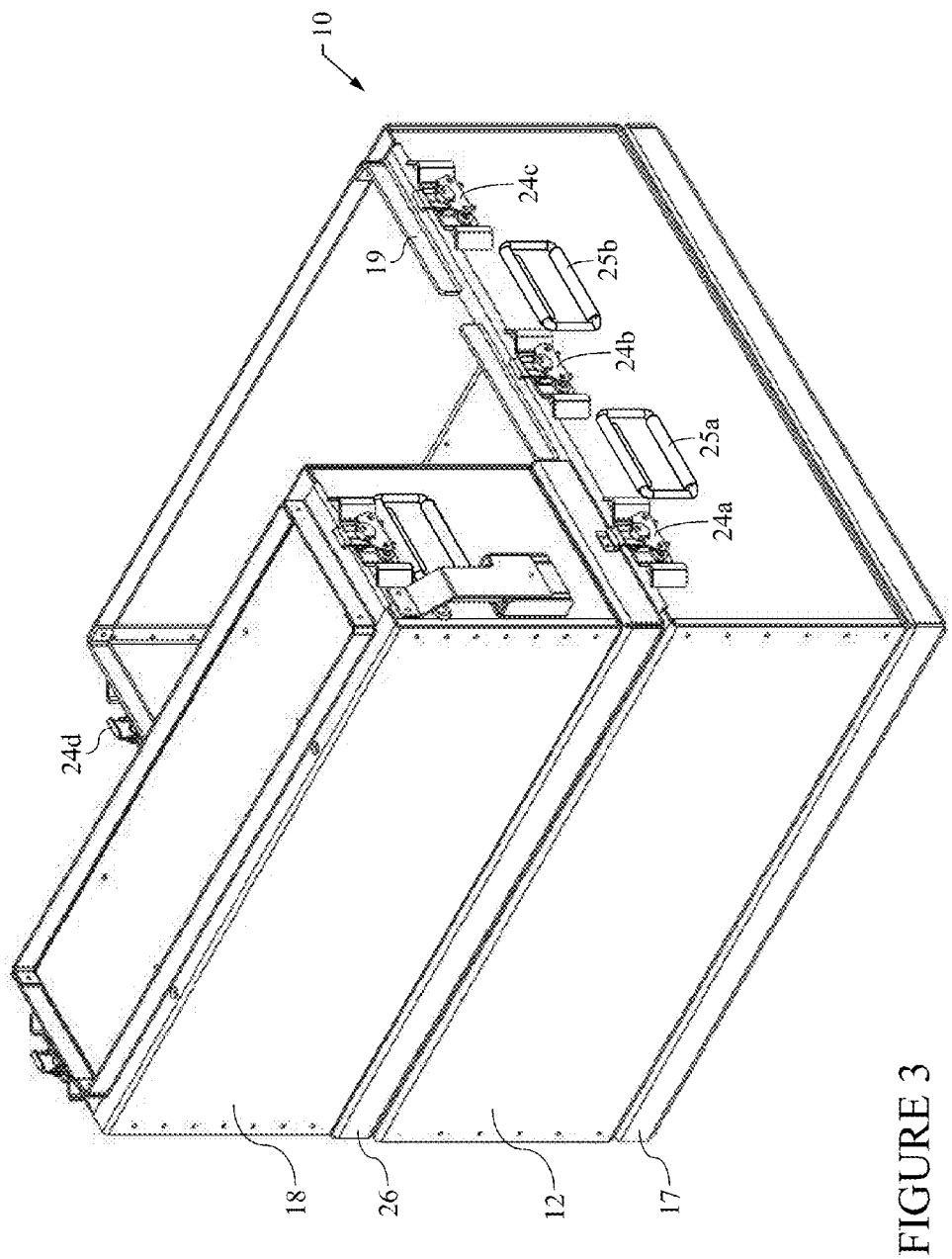
FIG. 3 is a perspective view of the portable base with the battery box.

FIG. 3 depicts the portable base 10 having a base body 12. The portable base 10 can have a flanged base support 17 and a base top flange 19, which can be disposed around the perimeter opposite the flanged base support 17.

The portable base 10 is shown with three front base latches 24a, 24b, 24c and at least one back base latch 24d. More than three latches can be used on the front and on the back or the portable base.

Two base handles 25a, 25b are depicted on the front of the base body 12. More than two base handles can be used, and the base handles can be placed on all four sides of the portable base 10.

FIG. 3 further shows the battery box 18 stacked on the portable base 10. The battery box 18 and the portable base 10 can be latched together, with the battery box base 26.

Figure 4:
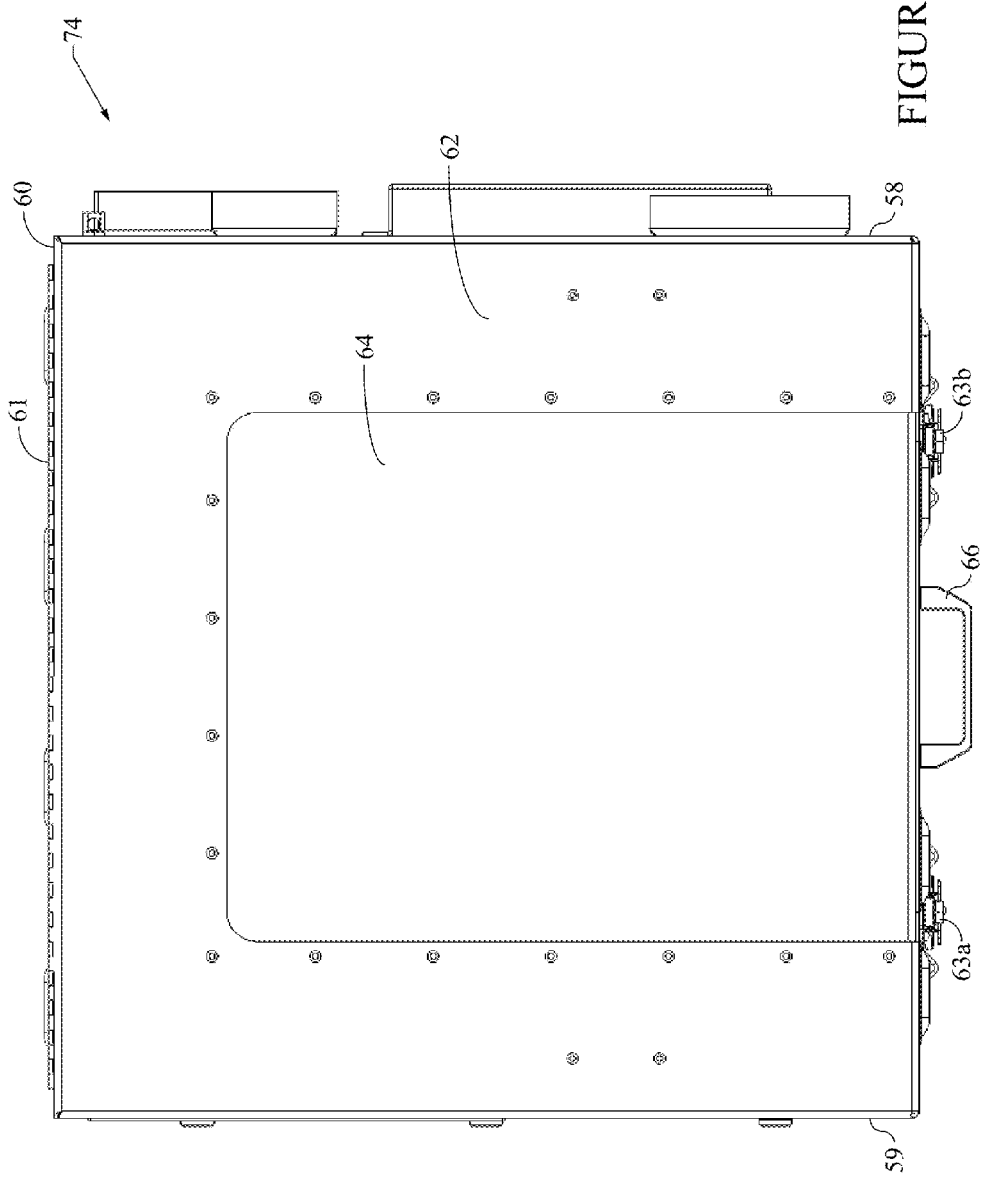
FIG. 4 is a top view of the stackable solar control cabinet with the openable destruction resistant cover in a closed position.

FIG. 4 shows a top view of the stackable solar control cabinet 74. The stackable solar control cabinet 74 is shown with a first side 58, a second side 59, and a back side 60. A hinge 61 is shown connecting the stackable solar control cabinet 74 to an openable vented destruction resistant cover 62.

The openable vented destruction resistant cover 62 can have at least one front cover latch. Two front cover latches 63a, 63b are shown in this Figure. The openable vented destruction resistant cover can further have a cover handle 66 and a viewing plate 64. The viewing plate can be polycarbonate and can be riveted to the metal.

Figure 5:
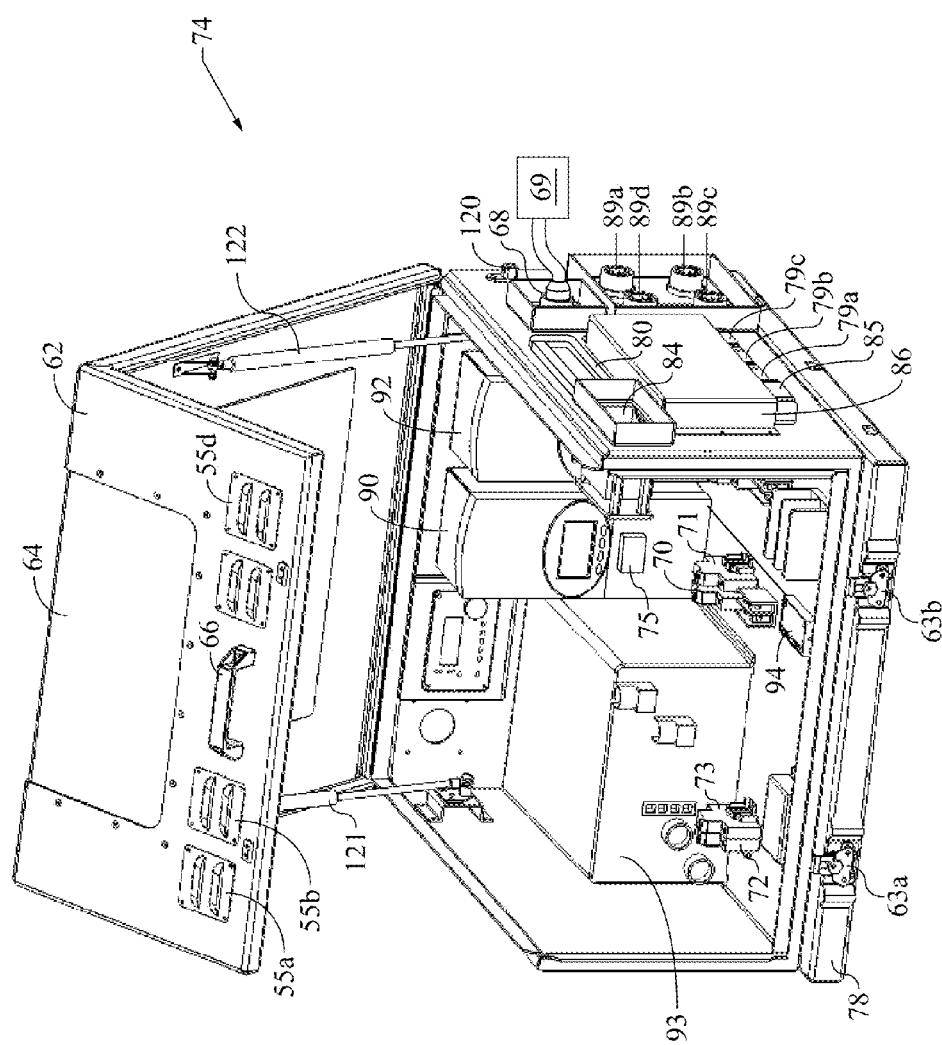
FIG. 5 is a perspective view of the stackable solar control cabinet with the openable destruction resistant cover in an open position.

FIG. 5 is perspective view of the stackable solar control cabinet 74, shown with the openable vented destruction resistant cover 62 maintained in an open position using a first hydraulic piston 121 and second hydraulic piston 122. The openable vented destruction resistant cover 62 can have a plurality of vents 55a, 55b, 55c, 55d.

The stackable solar control cabinet 74 can further have a gasket 65 is located on the sides for providing a water tight seal when the openable vented destruction resistant cover 62 is in the closed position.

First solar controller 90 and second solar controller 92 are shown in the stackable solar control cabinet 74. An example of a solar controller can be those made by Outback.

The first solar controller 90 and second solar controller 92 can have a first circuit breaker 70 and a second circuit breaker 71. In addition, a temperature sensor 75 can be used for sensing temperature in the stackable solar control cabinet 74.

First solar controller 90 can further be connected to a charge meter 94.

FIG. 5 further shows a battery charger 93. The battery charger can be optional. The battery charger 93 can be connected to a third circuit breaker 72 and a fourth circuit breaker 73. An example of a usable battery charger can be a Magnum, which can be used for charging 12 volt batteries from an AC power source.

The openable vented destruction resistant cover 62 can have viewing plate 64 as described earlier and latches 63a, 63b for latching the cover to the stackable solar control cabinet 74. The openable vented destruction resistant cover 62 is further shown with a cover handle 66.

The stackable solar control cabinet 74 is further shown with a cabinet base 78.

An AC receptacle 68 is depicted connected to an AC power source 69, a grounding means 120, and a load fuse 84 are shown disposed on the side of the stackable solar control cabinet 74. Additional receptacles 89a, 89b, 89c, 89d can be used to receive power from a solar array, which will be described in more detail later.

Additional non-removably mounted non-interchangeable battery connectors 79a, 79b, 79c can be connected to the outside of the stackable solar control cabinet 74.

A cabinet handle 80 is shown in this Figure. A load connector 85 can also be provided with a solar controller connector cover 86.

Figure 6:
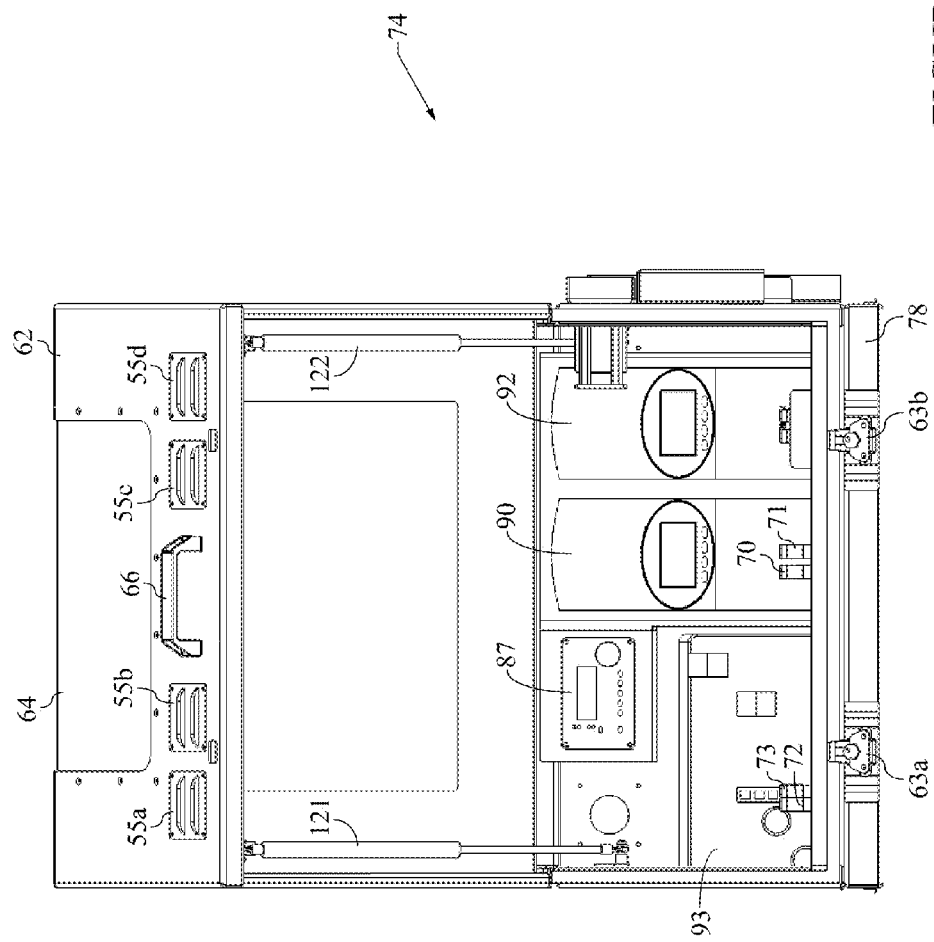
FIG. 6 is a front view of the stackable solar control cabinet.

FIG. 6 is a front view of the stackable solar control cabinet 74. The stackable solar control cabinet 74 is shown with an openable vented destruction resistant cover 62 with a viewing plate 64, a cover handle 66 and a plurality of vents, 55a, 55b, 55c, 55d. First hydraulic piston 121 and second hydraulic piston 122 are also shown.

In FIG. 6, the first solar controller 90 and second solar controller 92 are shown with battery charger controller 87 which can engage the battery charger 93. The battery charger controller and the battery charger can be optional in additional embodiments of the system.

FIG. 6 depicts the two front cover latches 63a, 63b and the cabinet base 78. The cabinet base 78 can interlock securely with the battery box 18, as described previously. First circuit breaker 70, second circuit breaker 71, third circuit breaker 72 and fourth circuit breaker 73 are also shown.

Figure 7:
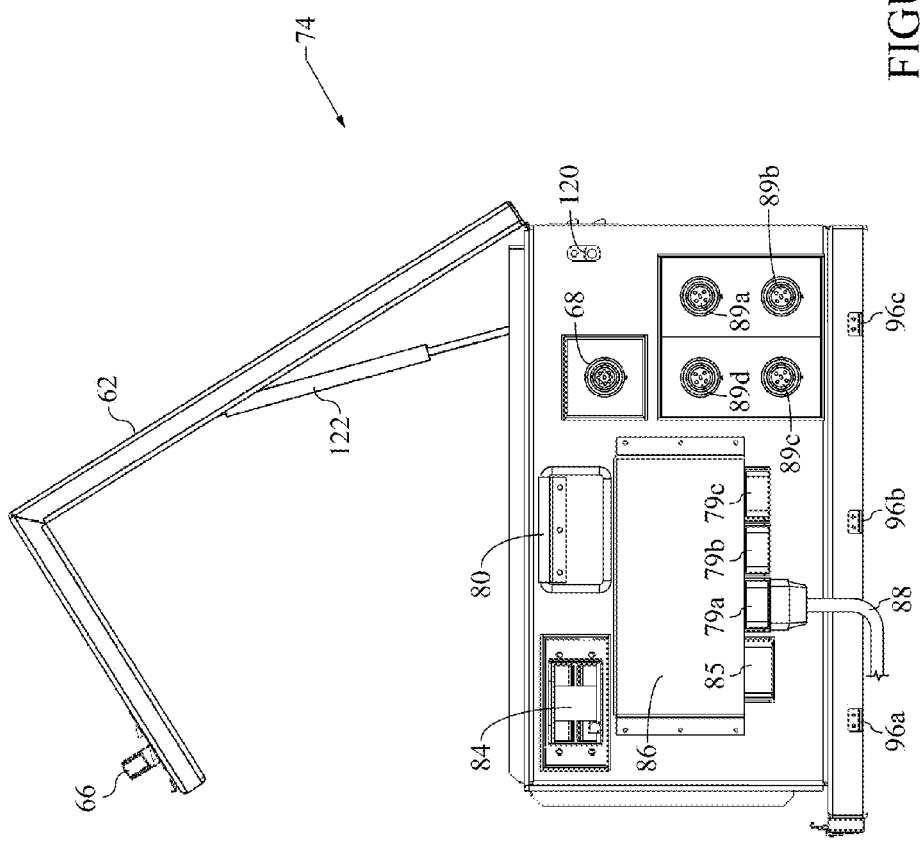
FIG. 7 is a side view of the stackable solar control cabinet.

FIG. 7 is a side view of the stackable solar control cabinet 74 with receptacles 89a, 89b, 89c, 89d. Also shown is grounding means 120 and the AC receptacle 68.

A load fuse 84 is shown in this Figure and adds a safety element to the system. The solar controller connector cover 86 can be disposed over the load connector 85 and the non-removably mounted non-interchangeable battery connectors 79a, 79b, 79c. Battery cable 88 can connect the non-removably mounted non-interchangeable battery connectors 79a, 79b, 79c to at least one battery, providing communication between the battery box 18 and the stackable solar control cabinet 74.

Additional latch connectors 96a, 96b, 96c are shown and can engage the first battery box latch and the second battery box latch from the battery box.

FIG. 7 further shows the openable vented destruction resistant cover 62 and the cover handle 66.

Figure 8:
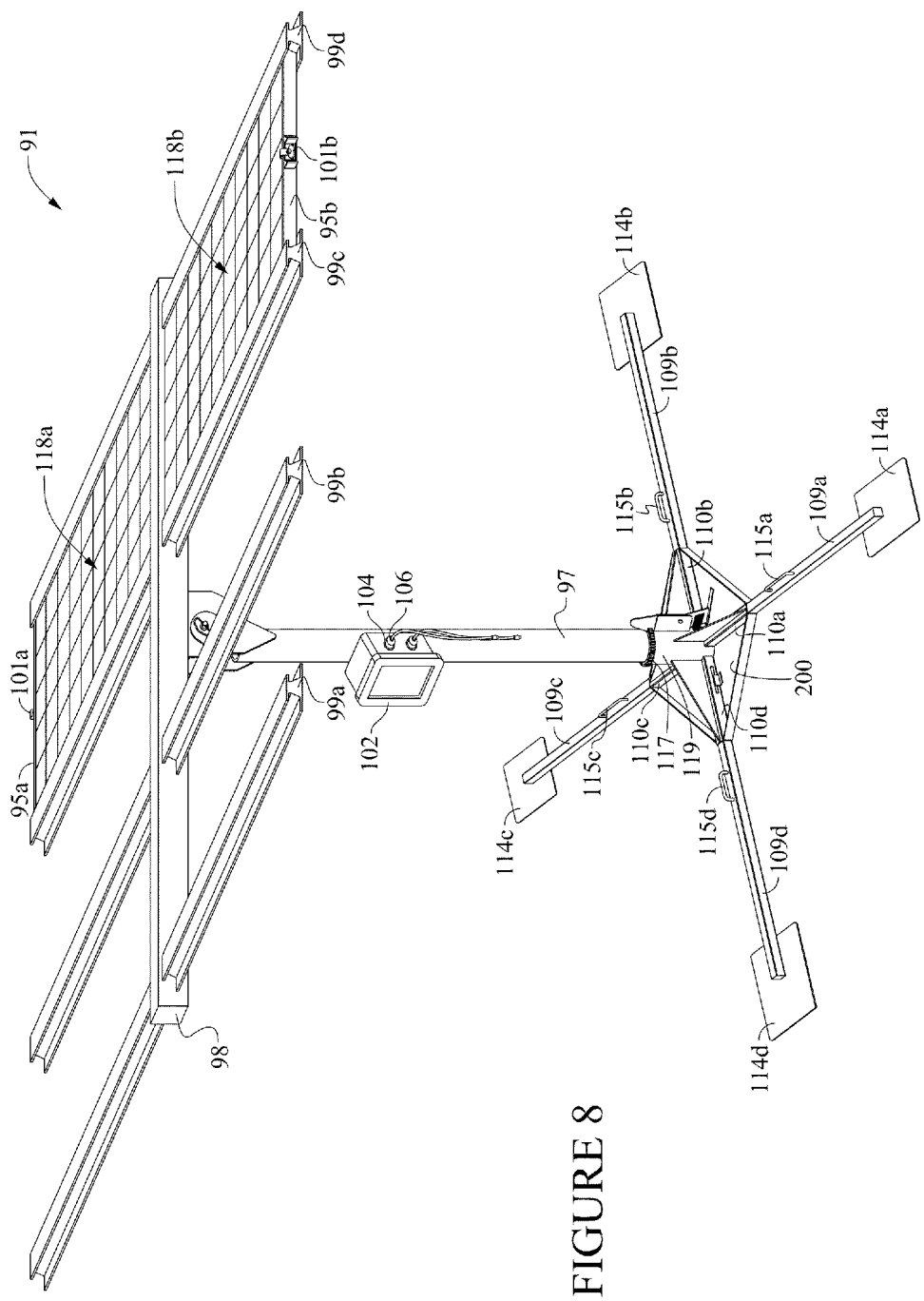
FIG. 8 is perspective view of the solar array.

FIG. 8 shows a solar array 91 usable with an embodiment of the system. The solar array 91 is shown with a base 200 with at least four removable slidable support arms 109a, 109b, 109c, 109d. The removable slidable support arms 109a, 109b, 109c, 109d can be connected to the base 200 with at least one support arm holder 110*a*, 110*b*, 110*c*, 110*d* for each removable slidable support arm.

Each of the removable slidable support arms 109*a*, 109*b*, 109*c*, 109*d* can have at least one foot 114*a*, 114*b*, 114*c*, 114*d* on each of the arms end.

Each removable slidable support arms 109*a*, 109*b*, 109*c*, 109*d* can each have at least one handle 115*a*, 115*b*, 115*c*, 115*d*. In additional embodiments, more than one handle can be disposed on each of the removable slidable support arms.

A holder 119 with a toothed collar 117 can be secured to the base 200. A mast 97 can further be secured into the holder 119.

The mast 97 can support a mounting backbone 98 with a plurality of mounting ribs 99*a*, 99*b*, 99*c*, 99*d*. Each mounting rib 99*a*, 99*b*, 99*c*, 99*d* can slide through and can project from the mounting backbone 98.

This embodiment can allow the solar array 91 to have increased strength and flexibility while allowing the entire solar array 91 to be collapsible for transport and storage into small spaces.

FIG. 8 further shows solar panels 118*a*, 118*b* each having a frame 95*a*, 95*b* for slidably engaging the plurality of mounting ribs 99*a*, 99*b*, 99*c*, 99*d*.

A combiner box 102 can be secured to the mast 97 and can communicate between the solar panels 118*a*, 118*b* and the solar controllers 90, 92 of the stackable solar control cabinet 74. The combiner box 102 can contain a plug connector 106 and a socket 104, which can be polarized.

Figure 9:
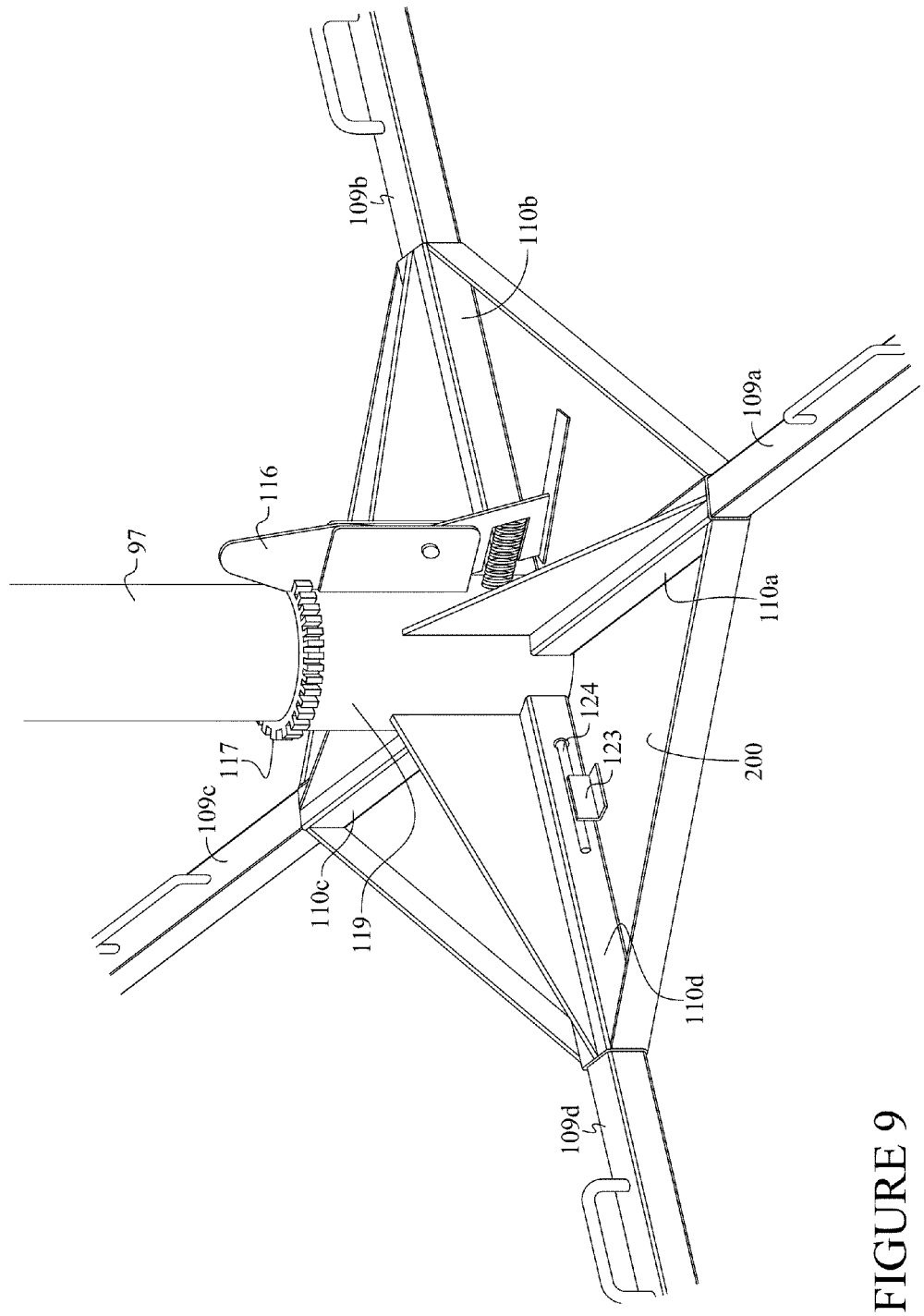
FIG. 9 is a perspective view of a base used to hold the solar array.

FIG. 9 is a perspective view of the base 200 with the mast 97 engaging the holder 119 with the toothed collar 117. The mast 97 can be secured to the toothed collar 117 with at least one mast lock 116.

The removable slidable support arms 109*a*, 109*b*, 109*c*, 109*d* are shown. Removable slidable support arm 109*a* is shown with a fastener 124. Each fastener 124 can be held in place with a support insert 123. A fastener can be disposed on each removable slidable support arm.

FIG. 9 also shows the removable slidable support arms 109*a*, 109*b*, 109*c*, 109*d* connected to the base 200 with at least one support arm holder 110*a*, 110*b*, 110*c*, 110*d* for each removable slidable support arm as described in previous Figures.

Figure 10:
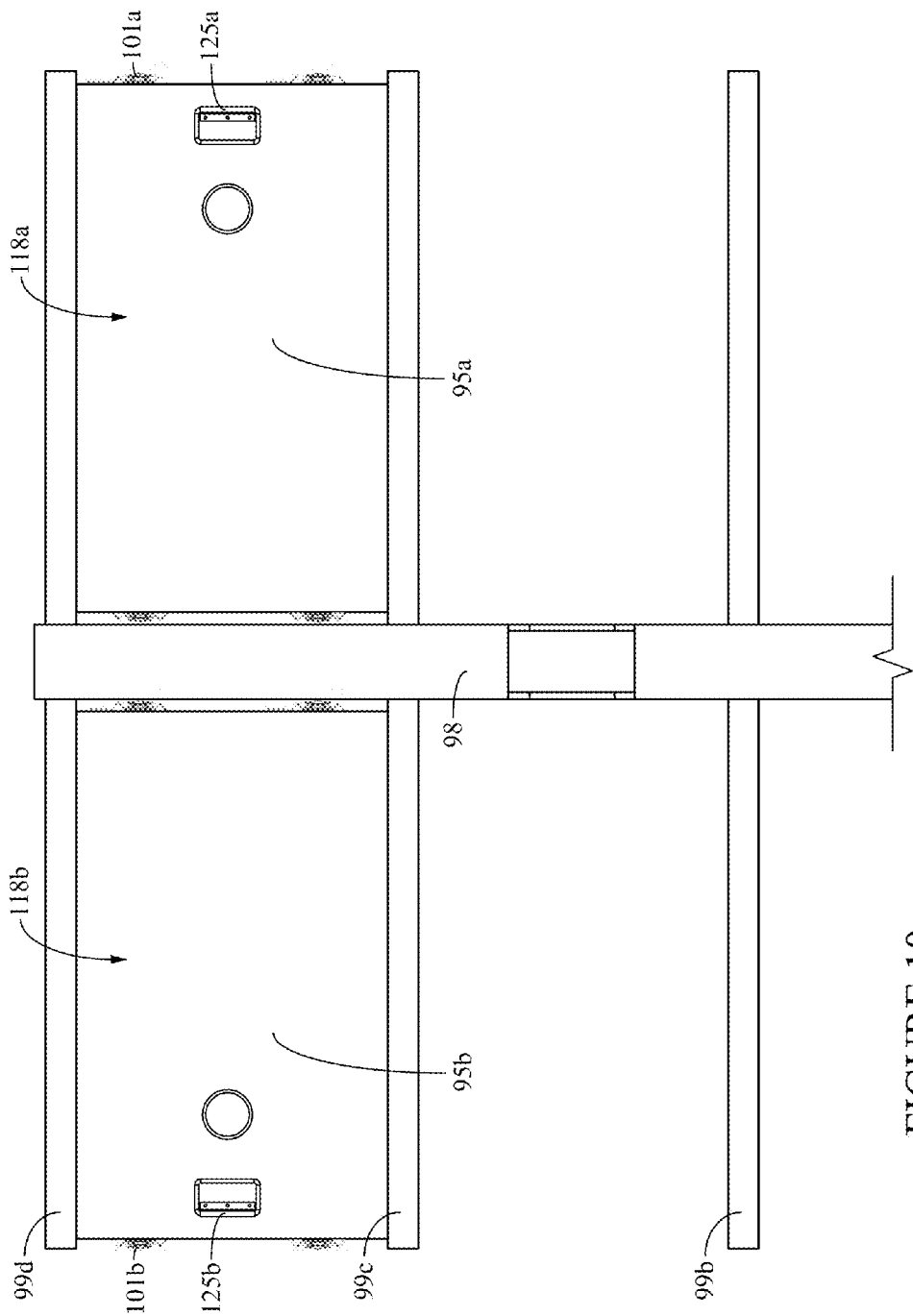
FIG. 10 is an additional view of the solar array.

FIG. 10 shows another view of the solar panel 118*a*, 118*b* each having a frame 95*a*, 95*b* for slidably engaging the plurality of mounting ribs 99*a*, 99*b*, 99*c*, 99*d*.

In this Figure, each frame 95*a*, 95*b* can have a handle 125*a*, 125*b* on the underneath side of the frame and at least one frame latch 101*a*, 101*b* for connecting the frames 95*a*, 95*b* together. Each frame can then slidably engage at least one of the mounting ribs 99*a*, 99*b*, 99*c*, 99*d*.

In an additional embodiment, the at least one frame latch 101*a*, 101*b* can be used to engage the solar panel to the mounting rib.

Figure 11:
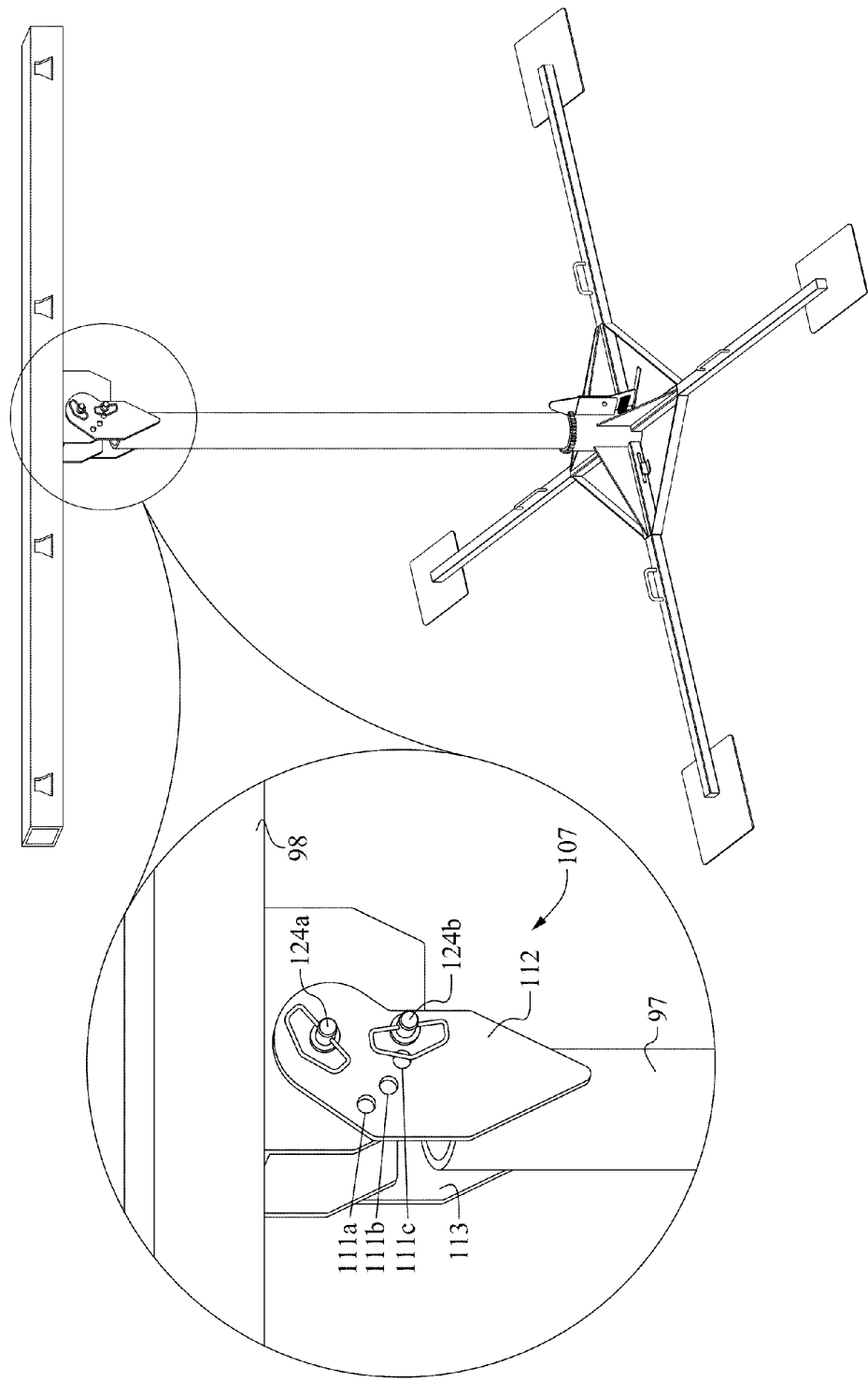
FIG. 11 is a perspective view of the solar panel tilt assembly.

FIG. 11 shows a detail of the solar panel tilt assembly 107 which can secure to the mast 97 and the mounting backbone 98. The solar panel tilt assembly 107 can be made from a first plate and a second plate together with a plurality of holes 111*a*, 111*b*, 111*c*, at least one pin 124*a*, 124*b* and the mounting backbone 98.

While these embodiments have been described with emphasis on the embodiments, it should be understood that within the scope of the appended claims, the embodiments might be practiced other than as specifically described herein.

What is claimed is:

1. A tactical portable solar control system comprising:
    a. a portable base comprising:
        i. a base body;
        ii. at least two base handles secured to the base body;
        iii. at least a first front base latch secured to the base body and at least a second front base latch secured to the base body opposite the first front base latch;
        iv. a flanged base support disposed on a bottom perimeter of the base body for supporting the base body; and
        v. a base top flange disposed at a top of the base body;
    b. a lightweight destruction resistant battery box removably secured to the portable base with the first front base latch and the second front base latch, wherein the battery box comprises:
        i. a battery box base connected to a front, a back, a first side and a second side;
        ii. an integral projecting top flange having a top edge disposed around the front, the back, the first side and the second side;
        iii. at least a first hold down brace between the first side and the second side disposed below the top edge of the integral projecting top flange;
        iv. a shatter resistant plate disposed within the integral projecting top flange beneath the top edge and over the at least one hold down brace secured to the at least one hold down brace with at least one fastener;
        v. a non-removably mounted non-interchangeable battery connector secured to the front engaging a side battery box cable disposed between at least one battery in the battery box and the non-removably mounted non-interchangeable battery connector;
        vi. at least one battery connector safety cover disposed over the non-removably mounted non interchangeable battery connector and secured to a side wall of battery box; and
        vii. a first battery box latch disposed on the front and a second battery box latch disposed on the back for connecting the battery box to the portable base;
    c. a stackable solar control cabinet comprising:
        i. a first side, a second side and a back side connected to a cabinet base;
        ii. an openable vented destruction resistant cover connected to the stackable solar control cabinet;
        iii. at least one solar controller in the stackable solar control cabinet;
        iv. a first circuit breaker between the at least one battery and the solar controller and a second circuit breaker between the solar controller and a solar array;
        v. at least one receptacle for receiving power from the solar array to provide a current to an outside source and at least one load connector disposed outside the stackable solar control cabinet for powering a load; and
        vi. at least one cover latch for fastening to the openable vented destruction resistant cover to the stackable solar control cabinet and wherein the first battery box latch and the second battery box latch secure the stackable solar control cabinet to the battery box and the first front base latch and the second front base latch secure the base to the battery box forming a stacked assembly;
    d. a solar array in communication with the stackable solar control cabinet, and wherein the solar array comprises:
        i. a mast connected to a base;
        ii. a mounting backbone connected to the mast;
        iii. a plurality of mounting ribs disposed on the mounting backbone;
        iv. at least one solar panel mounted to each mounting rib; and v. a combiner box disposed on the mast, wherein the combiner box comprises a socket for collecting the power from the solar panel and a plug connector for transferring the power from the at least one solar panel to the non-removably mounted non-interchangeable battery connectors on the stackable solar control cabinet, wherein power from the at least one solar panel is used to provide electrical power to electrical devices in the field;

wherein, a battery cable communicates between the battery box and the stackable solar control cabinet.

2. The tactical portable solar control system of claim 1, further comprising a battery charger, a AC input receptacle connected to an AC power source, and a charge meter for each battery connected to the battery charger.

3. The tactical portable solar control system of claim 1, further comprising a gasket and at least one hydraulic piston disposed between the stackable solar control cabinet and the openable vented destruction resistant cover.

4. The tactical portable solar control system of claim 1, wherein each solar panel is contained within a frame.

5. The tactical portable solar control system of claim 4, wherein each frame has a frame handle and at least one frame latch for connecting the frames together, and wherein each frame slidably engages at least one of the mounting ribs.

6. The tactical portable solar control system of claim 1, further comprising a solar controller connector cover.

7. The tactical portable solar control system of claim 1, further comprising a temperature sensor connected to at least one solar controller.

8. The tactical portable solar control system of claim 1, wherein the openable vented destruction resistant cover comprises a viewing plate of shatter resistant transparent material.

9. The tactical portable solar control system of claim 1, further comprising a load fuse connected to the solar controller.

10. The tactical portable solar control system of claim 1, further comprising a solar panel tilt assembly connected between the mounting backbone and the mast providing variable degrees of tilt for the at least one solar panel.

11. The tactical portable solar control system of claim 1, wherein the base of the solar array comprises a plurality of removable slidable support arms secured to the base.

12. The tactical portable solar control system of claim 11, wherein each of the removable slidable support arms has at least one support arm handle.

13. The tactical portable solar control system of claim 11, wherein the base of the solar array further comprises at least one support arm holder connected to the base to support each removable slidable support arm.

14. The tactical portable solar control system of claim 11, wherein the base of the solar array is secured to each of the removable slidable support arms with at least one fastener enabling the solar array assembly to be collapsible and provide a small profile for transport.

15. The tactical portable solar control system of claim 1, further comprising a foot disposed on each end of the removable slidable support arms providing additional stability to the mast.

16. The tactical portable solar control system of claim 1, wherein the base of the solar array comprises a holder allowing 360 rotation of the mast and a mast lock for locking the mast at a desired degree of rotation.

17. The tactical portable solar control system of claim 16, wherein the mast comprises a toothed collar disposed on the holder enabling quick re-orientation of the mast and locking with the mast lock.

18. The tactical portable solar control system of claim 1, wherein the openable vented destruction resistant cover is L-shaped and connected by a hinge to the back side.

19. The tactical portable solar control system of claim 1, further comprising a grounding means disposed on the outside of the stackable solar control cabinet.

20. The tactical portable solar control system of claim 1, wherein no single component of the system weighs more than 170 pounds.

21. The tactical portable solar control system of claim 1, wherein the first circuit breaker communicates between the solar array and the solar controller and the second circuit breaker communicates between the at least one battery and the solar controller.

22. The tactical portable solar control system of claim 1, wherein the shatter resistant protective plate of the battery box is a plate of transparent polycarbonate.

23. The tactical portable solar control system of claim 1, wherein the at least one solar panel is a 12 volt panel.

24. The tactical portable solar control system of claim 1, further comprising a safety fuse disposed in the battery box connected to the at least one battery.

* * * * *